US008139629B2

(12) United States Patent
Muramatsu et al.

(10) Patent No.: US 8,139,629 B2
(45) Date of Patent: Mar. 20, 2012

(54) ADAPTIVE CONTROLLER

(75) Inventors: Atsushi Muramatsu, Komaki (JP); Hironori Koyama, Kasugai-ken (JP)

(73) Assignee: Tokai Rubber Industries, Ltd., Komaki-shi (JP)

( * ) Notice: Subject to any disclaimer, the term of this patent is extended or adjusted under 35 U.S.C. 154(b) by 1422 days.

(21) Appl. No.: 11/680,100

(22) Filed: Feb. 28, 2007

(65) Prior Publication Data

US 2007/0206669 A1 Sep. 6, 2007

(30) Foreign Application Priority Data

Mar. 1, 2006 (JP) ................................ 2006-054879

(51) Int. Cl.
*H03K 5/159* (2006.01)

(52) U.S. Cl. ......................................... 375/232; 700/31

(58) Field of Classification Search ..................... 700/28
See application file for complete search history.

(56) References Cited

U.S. PATENT DOCUMENTS

| | | | | |
|---|---|---|---|---|
| 5,124,626 | A * | 6/1992 | Thoen | 318/610 |
| 5,359,520 | A * | 10/1994 | Aubrun et al. | 700/44 |
| 5,544,080 | A * | 8/1996 | Kobayashi et al. | 700/280 |
| 6,256,545 | B1 * | 7/2001 | Kimura et al. | 700/28 |
| 6,459,970 | B2 * | 10/2002 | Goto et al. | 701/36 |
| 6,678,177 | B2 * | 1/2004 | Asano et al. | 363/98 |
| 7,343,016 | B2 * | 3/2008 | Kim | 381/71.12 |
| 2001/0053951 | A1 * | 12/2001 | Goto et al. | 701/36 |
| 2005/0113979 | A1 * | 5/2005 | Ichikawa | 700/280 |
| 2007/0282464 | A1 * | 12/2007 | Miyake | 700/31 |
| 2008/0192948 | A1 * | 8/2008 | Kan et al. | 381/71.4 |
| 2009/0210139 | A1 * | 8/2009 | Gecim et al. | 701/111 |

FOREIGN PATENT DOCUMENTS

| | | |
|---|---|---|
| JP | 6-138888 | 5/1994 |
| JP | 6-195089 | 7/1994 |
| JP | 9-319403 | 12/1997 |
| JP | 2005-309662 | 11/2005 |

OTHER PUBLICATIONS

Office Action issued Mar. 22, 2011 in Japan Application No. 2006-054879 (With Partial English Translation).

* cited by examiner

*Primary Examiner* — Shuwang Liu
*Assistant Examiner* — Santiago Garcia
(74) *Attorney, Agent, or Firm* — Oblon, Spivak, McClelland, Maier & Neustadt, L.L.P.

(57) ABSTRACT

An adaptive controller includes an adaptive-signal generator for generating an adaptive signal, which includes a first amplitude filter coefficient and a first phase filter coefficient, in a first transfer path based on an angular frequency of a cyclic signal, which a vibration generation source generates; a first residual-error detector for detecting a first residual error at a first observation point in the first transfer path; an observation-point target-value setter for setting a residual-error target value, which includes an amplitude target value complying with the angular frequency; and a first filter-coefficient updater for updating the first amplitude filter coefficient and the first phase filter coefficient based on the angular frequency, the first residual error and the residual-error target value. Thus, when adding the adaptive signal to the cyclic signal, the adaptive controller can make the residual error, which results from the addition, not equal to zero intentionally.

9 Claims, 3 Drawing Sheets

ADAPTIVE CONTROLLER

INCORPORATION BY REFERENCE

This invention is based on Japanese Patent Application No. 2006-54,879, filed on Mar. 1, 2006, the entire contents of which are incorporated herein by reference.

BACKGROUND OF THE INVENTION

1. Field of the Invention

The present invention relates to an adaptive controller for cyclic signal, which a vibration generation source generates. The adaptive controller actively removes the influences of cyclic signal, which the cyclic signal exerts to an objective evaluation point, by adding an adaptive signal, which synchronizes with the cyclic signal, to the cyclic signal. Thus, the adaptive controller reduces vibration actively at the objective evaluation point.

2. Description of the Related Art

JP-A-2005-309,662, for instance, discloses a conventional adaptive controller. The patent publication sets forth to make a differential computed value zero. The differential computed value herein is produced by adding an adaptive signal to a signal, which a vibration generation source generates.

When one and only transfer path is present from a vibration generation source to an objective evaluation point, such a conventional adaptive controller, which makes a differential computed value zero, can surely make a vibration at the objective observation point zero.

However, when a plurality of transfer paths are present from a vibration generation to an objective evaluation point, the following problems arise if the conventional adaptive controller is applied to control a vibration, which occurs in one of the transfer paths.

Firstly, suppose that no adaptive control is applied to a plurality of transfer paths, vibrations, which are transferred by way of a plurality of transfer paths, cancel with each other so that a vibration at an objective evaluation might be reduced consequently. In such a situation, when the conventional adaptive controller is applied to one of the transfer paths, a vibration, which occurs in one of the transfer paths, is reduced, and accordingly does not act to cancel vibrations, which occur in the other transfer paths. As a result, there is a fear that a vibration at an objective evaluation might be enlarged adversely.

Secondly, vibrations, which are transferred by way of a plurality of transfer paths, might often exhibit different proportions of contribution to an objective evaluation point for every frequency, respectively. For example, when the conventional adaptive controller is applied to one of the transfer paths, it is possible to reduce a vibration at an objective evaluation point if a vibration, which occurs in the one of the transfer paths, contributes greatly to canceling the frequency of a vibration at an objective evaluation point. However, in the other frequency bands, even if the conventional adaptive controller is applied to one of the transfer paths, it might not be possible to reduce a vibration at an objective evaluation point so much. In this instance, since the reduction magnitude of vibrations differ for every frequency, the changing proportion of vibration might enlarge with respect to the change of frequency. That is, the gap between the crests and roots of vibration might enlarge. Such a change might give unpleasant feelings to certain people.

Moreover, it has been attracting engineers' attention to make tones by utilizing vibrations and/or noises. However, when the conventional adaptive controller is applied to the making of tunes, it is necessary to generate vibration anew in making tunes because the conventional adaptive controller operates to make vibrations and/or noises zero at an objective evaluation point. Consequently, such a tune making is very poor in terms of the energy efficiency.

SUMMARY OF THE INVENTION

The present invention has been developed in view of such a circumstance. It is therefore an object of the present invention to provide an adaptive controller for cyclic signal, adaptive controller which can operate so as not to make a residual error zero intentionally upon adding an adaptive signal to a cyclic signal.

An adaptive controller for cyclic signal according to the present invention actively reduces the influences of cyclic signal, which the cyclic signal exerts to an objective evaluation point by way of a predetermined transfer path, by adding an adaptive signal, which synchronizes with the cyclic signal, to the cyclic signal, which a vibration generation source generates, the predetermined transfer path comprising a first transfer path;

the adaptive controller comprising:

an adaptive-signal generator for generating the adaptive signal, whose constituent element comprises a first amplitude filter coefficient and a first phase filter coefficient, in the first transfer path based on an angular frequency of a specific frequency, the specific frequency being at least one frequency component selected from a plurality of frequency components making the cyclic signal;

a first residual-error detector for detecting a first residual error, which results from adding the adaptive signal to the cyclic signal by way of a predetermined first transfer characteristic, at a first observation point, which is located between the adaptive-signal generator and the objective estimation point in the first transfer path;

an observation-point target-value setter for setting a residual-error target value, a cyclic residual-error target value at the first observation point, based on the angular frequency, the residual-error target value comprising an amplitude target value complying with the angular frequency; and a first filter-coefficient updater for updating the first amplitude filter coefficient and the first phase filter coefficient based on the angular frequency, the first residual error and the residual-error target value.

The present adaptive controller for cyclic signal updates the first filter coefficient and the first phase filter coefficient, using the cyclic residual-error target value. Thus, the present adaptive controller generates an adaptive signal, in which the updated first amplitude filter coefficient and first phase filter coefficient are used. That is, the present adaptive controller does not make the residual error zero at the first observation point, but generates an adaptive signal with the adaptive-signal generator so as to make the residual error at the first observation point the residual-error target value. Note herein that the residual-error target value is a cyclic signal whose amplitude is an amplitude target value. Therefore, when a plurality of transfer paths are present from the vibration generation source to the objective evaluation point, the present adaptive controller can inhibit the vibration at the objective evaluation point from enlarging adversely, and can make the gap between the crests and roots of the vibration smaller. Moreover, when carrying out a tone making, the present adaptive controller exhibits improved energy efficiency because it can utilize a signal which is equivalent to the residual-error target value.

Moreover, in the present adaptive controller, it is advisable that the residual-error target value can comprise a phase target value, which complies with the angular frequency. Specifically, in this instance, the residual-error target value comprises an amplitude target value and a phase target value, which comply with the angular frequency. That is, the present adaptive controller can make a phase of the residual-error target value at the first observation point different from a phase of the cyclic signal, which the vibration generation source generates.

For example, when a plurality of transfer paths are present from a vibration generation source to an objective evaluation point, the phase of vibration, which is transferred by way of one of the transfer paths, might differ from the phase of vibration, which is transferred by way of the other one of the transfer paths. Moreover, when an adaptive signal is generated with respect to a vibration, which is transferred by way of one of the transfer paths, it is desirable to match a residual-error phase at a first observation in one of the transfer paths to a phase of vibration, which is transferred by way of the other one of the transfer paths. Accordingly, when a residual-error target value comprises a phase target value, it is possible to adequately adjust a residual-error phase at a first observation point. Consequently, when a plurality of transfer paths are present, it is possible to securely control a vibrating system so as to inhibit an objective evaluation point from vibrating.

Here, when the residual-error target value comprises an amplitude target value, it is advisable that the first filter-coefficient updater can update the first amplitude filter coefficient and the first phase filter coefficient in the following manner.

Specifically, the present adaptive controller can preferably further comprise a first estimated-transfer-function calculator for calculating an estimated value for a transfer function of the first transfer characteristic based on the angular frequency, wherein:

the adaptive-signal generator can preferably generate the adaptive signal in the first transfer path, the adaptive signal being produced according to following Equation (1); and the first filter-coefficient updater can preferably update the first amplitude filter coefficient and the first phase filter coefficient in Equation (1) according to following Equations (2), (3) and (4) or following Equations (5), (6) and (7) based on the angular frequency, the first residual error, the first transfer-function estimated value and the residual-error target value, $$y1_n = a1_n \cdot \sin(\omega \cdot t_n + \phi1_n) \qquad \text{Equation (1):}$$

wherein:

$y1_n$: Adaptive Signal;

$a1_n$: First Amplitude Filter Coefficient;

$\phi1_n$: First Phase Filter Coefficient;

ω: Angular Frequency of Specific Frequency (i.e., One of Frequency Components of Cyclic Signal);

$t_n$: Time (i.e., Sampling Cycle T×Discrete Time n); and n: Discrete Time;

$$a1_{n+1} = a1_n - \mu_{a1} \cdot Ah1 \cdot (e1_n - \text{et arg et}_n) \cdot \sin(\omega \cdot t_n + \phi1_n + \Phi h1) \qquad \text{Equation (2):}$$

$$\phi1_{n+1} = \phi1_n - \mu_{\phi1} \cdot (e1_n - \text{et arg et}_n) \cdot \cos(\omega \cdot t_n + \phi1_n + \Phi h1) \qquad \text{Equation (3):}$$

$$\text{et arg et}_n = a_e \cdot \sin(\omega \cdot t_n) \qquad \text{Equation (4):}$$

wherein:

$\mu_{a1}$: Step-size Parameter for First Amplitude;

$\mu_{\phi1}$: Step-size Parameter for First Phase;

Ah1: Amplitude Component of Estimated Value Gh1 for Transfer Function of First Transfer Characteristic Gh;

Φh1: Phase Component of Estimated Value Gh1 for Transfer Function of First Transfer Characteristic Gh;

$e1_n$: Residual-error Signal;

et arg $et_n$: Residual-error Target Value; and $a_e$: Amplitude Target Value;

$$a1_{n+1} = a1_n - \mu_{a1} \cdot Ah1 \cdot (e1_n - \text{et arg et}_n) \cdot \sin(\omega \cdot t_n + \phi1_n + \Phi h1) \qquad \text{Equation (5):}$$

$$\phi1_{n+1} = \phi1_n - \mu_{\phi1} \cdot Ah1 \cdot a1_n \cdot (e1_n - \text{et arg et}_n) \cdot \cos(\omega \cdot t_n + \phi1_n + \Phi h1) \qquad \text{Equation (6):}$$

$$\text{et arg et}_n = a_e \cdot \sin(\omega \cdot t_n). \qquad \text{Equation (7):}$$

Here, when updating the first amplitude filter coefficient and the first phase filter coefficient, two instances, updating them according to Equations (2), (3) and (4) or updating them according to Equations (5), (6) and (7), are available. Both of these instances exhibit convergence, which is identical to each other virtually. However, Equation (3) for updating the first phase filter coefficient is free of an amplitude component Ah1 of an estimated value Gh1 for a transfer function of a first transfer characteristic G1, and a first amplitude filter coefficient $a1_n$ thereof. On the other hand, Equation (6) for updating the first phase filter coefficient comprises an amplitude component Ah1 of an estimated value Gh1 for a transfer function of a first transfer characteristic G1, and a first amplitude filter coefficient $a1_n$ thereof. Therefore, when updating the first phase filter coefficient, it is possible to reduce the computational load more in the instance using Equation (3) than in the instance using Equation (6). As a result, it is possible to use a microcomputer with low computational processing ability, and thereby it is possible to intend to make the present adaptive controller at reduced cost.

Moreover, when the residual-error target value comprises an amplitude target value, and a phase target value, it is advisable that the first filter-coefficient updater can update the first amplitude filter coefficient and the first phase filter coefficient in the following manner.

Specifically, the present adaptive controller can preferably further comprise a first estimated-transfer-function calculator for calculating an estimated value for a transfer function of the first transfer characteristic based on the angular frequency, wherein:

the adaptive-signal generator can preferably generate the adaptive signal in the first transfer path, the adaptive signal being produced according to following Equation (8); and the first filter-coefficient updater can preferably update the first amplitude filter coefficient and the first phase filter coefficient in Equation (8) according to following Equations (9), (10) and (11) or following Equations (12), (13) and (14) based on the angular frequency, the first residual error, the first transfer-function estimated value and the residual-error target value, $$y1_n = a1_n \cdot \sin(\omega \cdot t_n + \phi1_n) \qquad \text{Equation (8):}$$

wherein:

$y1_n$: Adaptive Signal;

$a1_n$: First Amplitude Filter Coefficient;

$\Phi1_n$: First Phase Filter Coefficient;

ω: Angular Frequency of Specific Frequency (i.e., One of Frequency Components of Cyclic Signal);

$t_n$: Time (i.e., Sampling Cycle T×Discrete Time n); and n: Discrete Time;

$$a1_{n+1}=a1_n-\mu_{a1}\cdot Ah1\cdot(e1_n-\text{et arg et}_n)\cdot\sin(\omega\cdot t_n+\phi1_n+\Phi h1) \quad \text{Equation (9):}$$

$$\phi1_{n+1}=\phi1_n-\mu_{\phi1}\cdot(e1_n-\text{et arg et}_n)\cdot\cos(\omega\cdot t_n+\phi1_n+\Phi h1) \quad \text{Equation (10):}$$

$$\text{et arg et}_n=a_e\cdot\sin(\omega\cdot t_n+\phi_e) \quad \text{Equation (11):}$$

wherein:

$\mu_{a1}$: Step-size Parameter for First Amplitude;

$\mu_{\phi1}$: Step-size Parameter for First Phase;

Ah1: Amplitude Component of Estimated Value Gh1 for Transfer Function of First Transfer Characteristic Gh;

Φh1: Phase Component of Estimated Value Gh1 for Transfer Function of First Transfer Characteristic;

$e1_n$: Residual-error Signal;

et arg $et_n$: Residual-error Target Value;

$a_e$: Amplitude Target Value; and $\phi_e$: Phase Target Value;

$$a1_{n+1}=a1_n-\mu_{a1}\cdot Ah1\cdot(e1_n-\text{et arg et}_n)\cdot\sin(\omega\cdot t_n+\phi1_n+\Phi h1) \quad \text{Equations (12):}$$

$$\phi1_{n+1}=\phi1_n-\mu_{\phi1}\cdot(e1_n-\text{et arg et}_n)\cdot\cos(\omega\cdot t_n+\phi1_n+\Phi h1) \quad \text{Equation (13):}$$

$$\text{et arg et}_n=a_e\cdot\sin(\omega\cdot t_n+\phi_e). \quad \text{Equation (14):}$$

Here, when updating the first amplitude filter coefficient and the first phase filter coefficient, two instances, updating them according to Equations (9), (10) and (11) or updating them according to Equations (12), (13) and (14), are available. Both of these instances exhibit convergence, which is identical to each other virtually. However, Equation (10) for updating the first phase filter coefficient is free of an amplitude component Ah1 of an estimated value Gh1 for a transfer function of a first transfer characteristic G1, and a first amplitude filter coefficient $a1_n$ thereof. On the other hand, Equation (13) for updating the first phase filter coefficient comprises an amplitude component Ah1 of an estimated value Gh1 for a transfer function of a first transfer characteristic G1, and a first amplitude filter coefficient $a1_n$ thereof. Therefore, when updating the first phase filter coefficient, it is possible to reduce the computational load more in the instance using Equation (10) than in the instance using Equation (13). As a result, it is possible to use a microcomputer with low computational processing ability, and thereby it is possible to intend to make the present adaptive controller at reduced cost.

Moreover, when the predetermined transfer path, which is present from the vibration generation source to the objective evaluation point, comprises the first transfer path, and a second transfer path which differs from the first transfer path. The observation-point target value setter can preferably set the amplitude target value based on a transfer characteristic of the second transfer path. Thus, it is possible to properly adjust the residual-error amplitude at the first observation point in the first transfer path with respect to a vibration, which is transferred to the objective evaluation point by way of the second transfer path. Therefore, it is possible to make a first vibration, which is transferred to the objective evaluation point by way of the first transfer path, and a second vibration, which is transferred to the objective evaluation point by way of the second transfer path, cancel with each other. As a result, it is possible to reduce the vibration at the objective evaluation point.

In addition, when setting the amplitude target value based on a transfer characteristic of the second transfer path, the following two manners are available.

According to first means for setting the amplitude target value, the observation-point target-value setter can preferably store the amplitude target value, which complies with the angular frequency, in advance, and can preferably set the amplitude target value based on the angular frequency of the cyclic signal, which the vibration generation source generates actually. That is, the amplitude target value for every angular frequency is stored as a map in advance, and an amplitude target value is set based on the angular frequency of the cyclic signal alone. Thus, it is possible to set an amplitude target value at a very high speed.

Moreover, second means for setting the amplitude target value is a method of setting the amplitude target value adaptively in the following manner. Specifically, according to the second means, the observation-point target-value setter can preferably comprise:

- an imaginary adaptive-signal generator for generating an imaginary adaptive signal in the second transfer path imaginarily, the imaginary adaptive signal being produced according to following Equation (15), whose constituent elements comprise the second amplitude filter coefficient and the second phase filter coefficient, based on the angular frequency;
- a vibration detector for detecting a second-observation-point vibration, which occurs based on the cyclic signal, at the second observation point in the second transfer path;
- an imaginary residual-error detector for detecting an imaginary residual error, which occurs by adding the imaginary adaptive signal to the cyclic signal imaginarily by way of a predetermined imaginary transfer characteristic at the second observation point based on the imaginary adaptive signal and the second-observation-point vibration;
- an imaginary transfer-function estimater for calculating an estimated value for a transfer function of the imaginary transfer characteristic based on the angular frequency;
- a second filter-coefficient updater for updating the second amplitude filter coefficient and the second phase filter coefficient in Equation (15) according to following Equations (16) and (17) or following Equations (18) and (19) based on the angular frequency, the imaginary residual error and the imaginary transfer-function estimated value; and
- an updated target-value setter for setting the updated second amplitude filter coefficient at the amplitude target value according to following Equation (20), $$y2_n=a2_n\cdot\sin(\omega\cdot t_n+\phi2_n) \quad \text{Equation (15):}$$

wherein:

$y2_n$: Imaginary Adaptive Signal;

$a2_n$: Second Amplitude Filter Coefficient $\phi2_n$: Second Phase Filter Coefficient ω: Angular Frequency of Specific Frequency (i.e., One of Frequency Components of Cyclic Signal); and $t_n$: Time (i.e., Sampling Cycle T×Discrete Time n);

$$a2_{n+1}=a2_n-\mu_{a2}\cdot Ah2\cdot e2_n\cdot\sin(\omega\cdot t_n+\phi2_n+\Phi h2) \quad \text{Equation (16):}$$

$$\Phi2_{n+1}=\phi2_n-\mu_{\phi2}\cdot e2_n\cdot\cos(\omega\cdot t_n+\phi2_n+\Phi h2) \quad \text{Equation (17):}$$

wherein:

$\mu_{a2}$: Step-size Parameter for Second Amplitude;

$\mu_{\phi2}$: Step-size Parameter for Second Phase;

Ah2: Amplitude Component of Estimated Value Gh2 for Transfer Function of Imaginary Transfer Characteristic G2;

Φh2: Phase Component of Estimated Value Gh2 for Transfer Function of Imaginary Transfer Characteristic G2; and $e2_n$: Imaginary Residual-error Signal;

$$a2_{n+1}=a2_n-\mu_{a2}\cdot Ah2\cdot e2_n\cdot\sin(\omega\cdot t_n+\phi2_n+\Phi h2) \quad \text{Equation (18):}$$

$$\Phi2_{n+1}=\phi2_n-\mu_{\phi2}\cdot e2_n\cdot\cos(\omega\cdot t_n+\phi2_n+\Phi h2) \quad \text{Equation (19):}$$

$$a_e=a2_{n+1}. \quad \text{Equation (20):}$$

By thus setting the amplitude target value adaptively, it is possible to produce the amplitude target value, which complies with a transfer characteristic of the second transfer path, with higher accuracy. Meanwhile, setting the amplitude target value adaptively as described above requires to speed up the computational processing.

Moreover, when the predetermined transfer path, which is present from the vibration generation source to the objective evaluation point, comprises the first transfer path, and a second transfer path which differs from the first transfer path. The observation-point target value setter can preferably set the phase target value based on a transfer characteristic of the second transfer path. Thus, it is possible to properly adjust the residual-error amplitude at the first observation point in the first transfer path with respect to a vibration, which is transferred to the objective evaluation point by way of the second transfer path. Therefore, it is possible to make a first vibration, which is transferred to the objective evaluation point by way of the first transfer path, and a second vibration, which is transferred to the objective evaluation point by way of the second transfer path, cancel with each other. As a result, it is possible to reduce the vibration at the objective evaluation point.

In addition, when setting the phase target value based on a transfer characteristic of the second transfer path, the following two manners are available.

According to first means for setting the phase target value, the observation-point target-value setter can preferably store the phase target value, which complies with the angular frequency, in advance, and can preferably set the phase target value based on the angular frequency of the cyclic signal, which the vibration generation source generates actually. That is, the phase target value for every angular frequency is stored as a map in advance, and the phase target value is set based on the angular frequency of the cyclic signal alone. Thus, it is possible to set the phase target value at a very high speed.

Moreover, second means for setting the phase target value is a method of setting the phase target value adaptively in the following manner. Specifically, according to the second means, the observation-point target-value setter can preferably comprise:

- an imaginary adaptive-signal generator for generating an imaginary adaptive signal in the second transfer path imaginarily, the imaginary adaptive signal being produced according to following Equation (21), whose constituent elements comprise the second amplitude filter coefficient and the second phase filter coefficient, based on the angular frequency;
- a vibration detector for detecting a second-observation-point vibration, which occurs based on the cyclic signal, at the second observation point in the second transfer path;
- an imaginary residual-error detector for detecting an imaginary residual error, which occurs by adding the imaginary adaptive signal to the cyclic signal imaginarily by way of a predetermined imaginary transfer characteristic at the second observation point based on the imaginary adaptive signal and the second-observation-point vibration;
- an imaginary transfer-function estimater for calculating an estimated value for a transfer function of the imaginary transfer characteristic based on the angular frequency;
- a second filter-coefficient updater for updating the second amplitude filter coefficient and the second phase filter coefficient in Equation (21) according to following Equations (22) and (23) or following Equations (24) and (25) based on the angular frequency, the imaginary residual error and the imaginary transfer-function estimated value; and
- an updated target-value setter for setting the updated second phase filter coefficient at the phase target value according to following Equation (26), $$y2_n = a2_n \cdot \sin(\omega \cdot t_n + \phi2_n) \quad \text{Equation (21):}$$

wherein:

$y2_n$: Imaginary Adaptive Signal;

$a2_n$: Second Amplitude Filter Coefficient $\Phi2_n$: Second Phase Filter Coefficient $\omega$: Angular Frequency of Specific Frequency (i.e., One of Frequency Components of Cyclic Signal); and $t_n$: Time (i.e., Sampling Cycle T×Discrete Time n);

$$a2_{n+1} = a2_n - \mu_{a2} \cdot Ah2 \cdot e2_n \cdot \sin(\omega \cdot t_n + \phi2_n + \Phi h2) \quad \text{Equation (22):}$$

$$\Phi2_{n+1} = \phi2_n - \mu_{\phi2} \cdot e2_n \cdot \cos(\omega \cdot t_n + \phi2_n + \Phi h2) \quad \text{Equation (23):}$$

wherein:

$\mu_{a2}$: Step-size Parameter for Second Amplitude;

$\mu_{\phi2}$: Step-size Parameter for Second Phase;

Ah2 Amplitude Component of Estimated Value Gh2 for Transfer Function of Imaginary Transfer Characteristic G2;

$\Phi h2$: Phase Component of Estimated Value Gh2 for Transfer Function of Imaginary Transfer Characteristic G2; and $e2_n$: Imaginary Residual-error Signal;

$$a2_{n+1} = a2_n - \mu_{a2} \cdot Ah2 \cdot e2_n \cdot \sin(\omega \cdot t_n + \phi2_n + \Phi h2) \quad \text{Equation (24):}$$

$$\phi2_{n+1} = \phi2_n - \mu_{\phi2} \cdot Ah2 \cdot a2_n \cdot e2_n \cdot \cos(\omega \cdot t_n + \phi2_n + \Phi h2) \quad \text{Equation (25):}$$

$$\phi_e = \phi2_{n+1}. \quad \text{Equation (26):}$$

By thus setting the phase target value adaptively, it is possible to produce the phase target value, which complies with a transfer characteristic of the second transfer path, with higher accuracy. Meanwhile, setting the phase target value adaptively as described above requires to speed up the computational processing.

When adding an adaptive signal to a cyclic signal, the present adaptive controller for cyclic signal can operate so as not to make the possible resultant residual error zero intentionally. Accordingly, when a plurality of transfer paths are present from a vibration generation source to an objective evaluation point, the present adaptive controller can inhibit a vibration at the objective evaluation point from enlarging adversely, and can make the gap between the crests and roots of the vibration smaller. Moreover, when carrying out a tone making, the present adaptive controller exhibits improved energy efficiency because it can utilize a signal which is equivalent to a residual-error target value.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Having generally described the present invention, a further understanding can be obtained by reference to the specific preferred embodiments which are provided herein for the purpose of illustration only and not intended to limit the scope of the appended claims.

The present invention will be hereinafter described in more detail while naming its specific embodiments.

(1) Outline Description on Adaptive Controller 1 for Cyclic Signal

Figure 1:
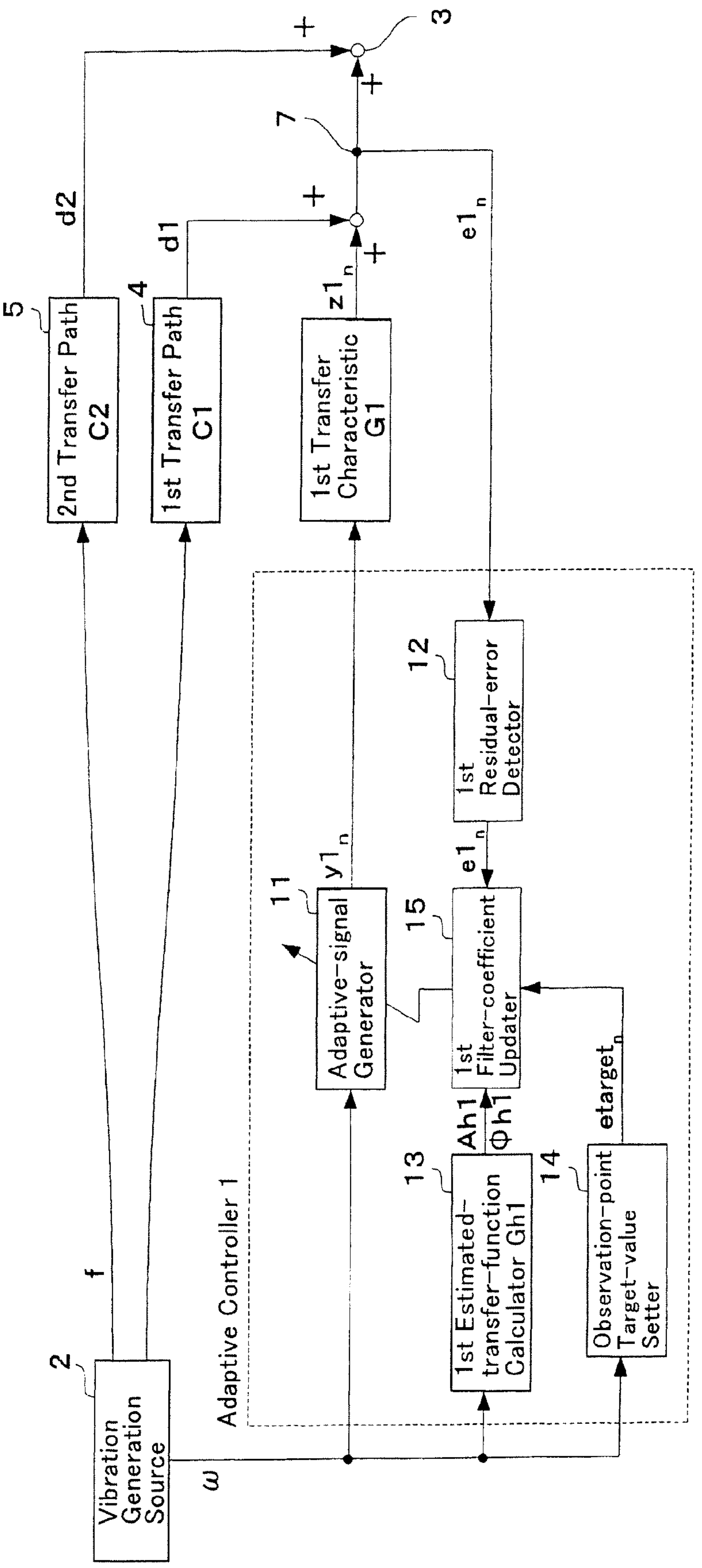
FIG. 1 is a block diagram for illustrating an adaptive controller 1 for cyclic signal according to Example No. 1 and Example No. 2 of the present invention.
Figure 2:
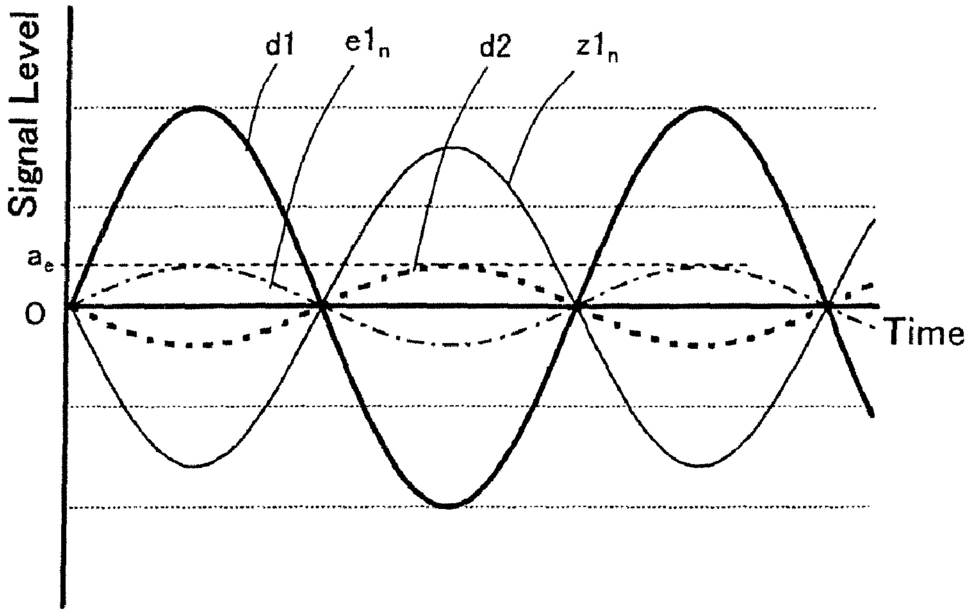
FIG. 2 is a diagram for illustrating signal levels when no phase target value is set.
Figure 3:
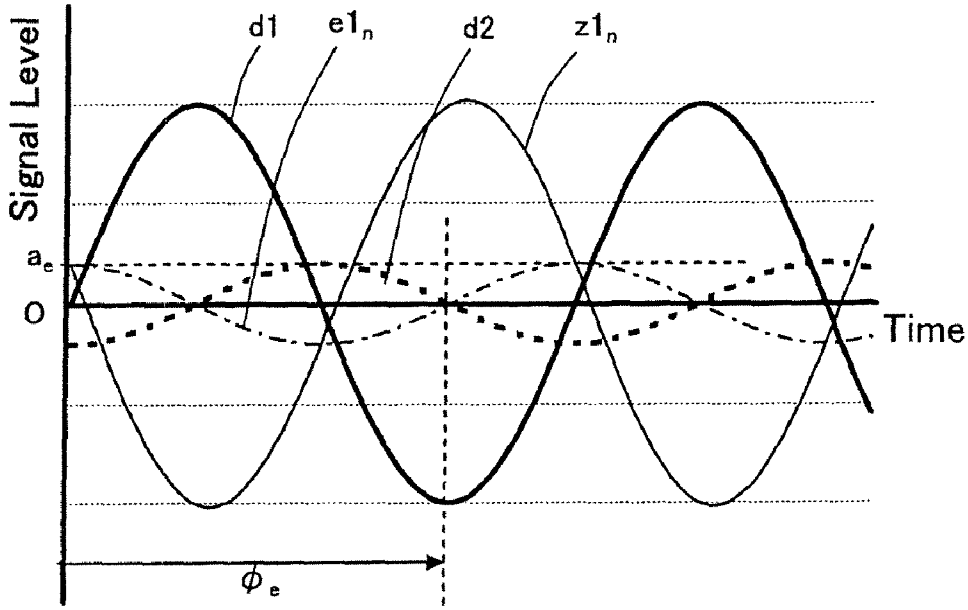
FIG. 3 is a diagram for illustrating signal levels when a phase target value is set.

An outline of an adaptive controller 1 for cyclic signal (hereinafter simply referred to as an "adaptive controller") will be described hereinafter with reference to FIGS. 1 through 3. FIG. 1 is a block diagram for illustrating an adaptive controller 1 according to Example Nos. 1 and 2 of the present invention. FIG. 2 is a diagram for illustrating signal levels when no phase target value is set. FIG. 3 is a diagram for illustrating signal levels when a phase target value is set.

First, an instance in which the adaptive controller 1 is not functioning will be described. As shown in FIG. 1, a vibration generation source 2 generates a cyclic signal f. The cyclic signal f is transferred to an objective evaluation point 3. Note that a first transfer path 4 and a second transfer path 5 are present in the transfer path from the vibration generation source 2 to the objective evaluation point 3. Here, in FIG. 1, a transfer characteristic of the first transfer path 4 is designated at C1, and a transfer characteristic of the second transfer path 5 is designated at C2. Specifically, at the objective evaluation point 3, the cyclic signal f, which the vibration generation source 2 generates, makes a synthesized signal. That is, a cyclic-signal component d1, which is transferred by way of the first transfer path 4, and a cyclic-signal component d2, which is transferred by way of the second transfer path 5 are synthesized to make the synthesized signal.

When starting the adaptive controller 1 functioning, the adaptive controller 1 operates in the following manner. The adaptive controller 1 produces an adaptive signal $Y1_n$ in the first transfer path 4. The produced adaptive signal $y1_n$ is transferred by way of a first transfer characteristic G1, and is turned into a signal $z1_n$. The resulting signal $z1_n$ is synthesized with the cyclic-signal component d1. Note herein that the adaptive controller 1 operates so as to match a residual error $e1_n$ at a first observation point 7 to a later-described residual-error target value $etarget_n$. Thus, at the objective evaluation point 3, the adaptive signal $y1_n$ is turned into a synthesized signal, which is made by synthesizing the error $e1_n$ at the first observation point 7 with the cyclic-signal component d2. Note that the first observation point 7 is positioned between a later-described adaptive-signal generator 11 and the objective evaluation point 3 within the inside of the first transfer path 4.

Hereinafter, when targeting on making a signal level at the objective evaluation point 3 zero, what sort of the adaptive signal $y_n$ the adaptive controller 1 produces will be described with reference to FIGS. 2 and 3.

In FIGS. 2 and 3, the cyclic-signal component d1 (hereinafter referred to as a "first transfer-signal component"), which is transferred by way of the first transfer path 4, is designated with the bold continuous line, and the cyclic-signal component d2 (hereinafter referred to as a "second transfer-signal component"), which is transferred by way of the second transfer path 5, is designated with the bold dashed line. Meanwhile, the signal $z1_n$ (hereinafter referred to as an "adaptive transfer signal"), which is made from the adaptive signal $y_n$ which the adaptive controller 1 generates and which is transferred by way of the first transfer characteristic G1, is designated with the fine continuous line, and the residual error $e1_n$ at the observation point 7 is designated with the fine chain line.

As shown in FIG. 2, the first transfer-signal component d1 comprises a signal component whose amplitude is larger than that of the second transfer-signal component d2 by a factor of about 3 times and whose phase differs from that of the second transfer-signal component d2 by 180 degrees. In this instance, in order to make the signal level at the objective evaluation point 3 zero, it is advisable to turn the residual error $e1_n$ at the first observation point 7 into a signal component whose amplitude is identical with that of the second transfer-signal component d2 and whose phase differs from that of the second transfer-signal component d2 by 180 degrees. Moreover, the residual error $e1_n$ at the first observation point 7 is a synthesized signal, which is made by synthesizing the first transfer-signal component d1 with the adaptive transfer signal $z1_n$. Therefore, the adaptive transfer signal $z1_n$ turns into a signal, which is made by subtracting the first transfer-signal component d1 from the residual error $e1_n$ at the first observation point 7.

The thus produced adaptive signal $z1_n$ comprises a signal component whose amplitude is smaller than that of the first transfer-signal component d1 by a factor of about ⅔ times and whose phase differs from that of the first transfer-signal component d1 by 180 degrees. Hence, it is advisable that the adaptive controller 1 can produce the adaptive signal $y1_n$ which turns into such an adaptive transfer signal $z1_n$ as described above when the adaptive signal $y1_n$ is transferred by way of the first transfer characteristic G1.

As shown in FIG. 3, the first transfer-signal component d1 comprises a signal component whose amplitude is larger than that of the second transfer-signal component d2 by a factor of about 3 times and whose phase differs from that of the second transfer-signal component d2 by 90 degrees. In this instance, in order to make the signal level at the objective evaluation point 3 zero, it is advisable to turn the residual error $e1_n$ at the first observation point 7 into a signal component whose amplitude is identical with that of the second transfer-signal component d2 and whose phase differs from that of the second transfer-signal component d2 by 180 degrees. Moreover, the residual error $e1_n$ at the first observation point 7 is a synthesized signal, which is made by synthesizing the first transfer-signal component d1 with the adaptive transfer signal $z1_n$. Therefore, the adaptive transfer signal $z1_n$ turns into a signal, which is made by subtracting the first transfer-signal component d1 from the residual error $e1_n$ at the first observation point 7.

The thus produced adaptive signal $z1_n$ comprises a signal component whose amplitude is slightly larger than that of the first transfer-signal component d1 and whose phase differs from that of the first transfer-signal component d1 by an angle being slightly larger than 180 degrees. Hence, it is advisable that the adaptive controller 1 can produce the adaptive signal $y1_n$ which turns into such an adaptive transfer signal $z1_n$ as described above when the adaptive signal $y1_n$ is transferred by way of the first transfer characteristic G1.

(2) Detailed Construction of Adaptive Controller 1 according to Example No. 1

Next, a detailed construction of the adaptive controller 1 according to Example No. 1 of the present invention will be hereinafter described with reference to FIG. 1. Here, note that the adaptive controller 1 is an application to an instance where it stores a residual-error target value $etarget_n$ in advance and the residual-error target value $etarget_n$ comprises an amplitude target value $a_e$ but does not comprise a phase target value $\phi_e$.

As illustrated in FIG. 1, the adaptive controller 1 according to Example No. 1 comprises an adaptive-signal generator 11, a first residual-error detector 12, a first estimated-transfer-function calculator 13, an observation-point target-value setter 14, and a first filter-coefficient updater 15.

The adaptive-signal generator 11 produces an adaptive signal $y_n$ in the first transfer path 4. The adaptive signal $y_n$ is obtained according to Equation (51) based on an angular frequency ω of a primary frequency component of a cyclic signal f, which the vibration generation source 2 generates. As can be seen from Equation (51), the adaptive signal $y_n$ comprises a primary sine wave. Specifically, the primary sine wave contains a first amplitude-filter coefficient $a\mathbf{1}_n$, and a first phase-filter coefficient $\phi\mathbf{1}_n$ as the constituent elements. Moreover, the first filter-coefficient updater 11 updates the first amplitude-filter coefficient $a\mathbf{1}_n$ and first phase-filter coefficient $\phi\mathbf{1}_n$ adaptively.

$$y1_n=a1_n\cdot\sin(\omega\cdot t_n+\phi1_n)\quad\text{Equation (51):}$$

wherein:

$y\mathbf{1}_n$: Adaptive Signal;

$a\mathbf{1}_n$: First Amplitude Filter Coefficient;

$\phi\mathbf{1}_n$: First Phase Filter Coefficient;

ω: Angular Frequency of Specific Frequency (i.e., One of Frequency Components of Cyclic Signal);

$t_n$: Time (i.e., Sampling Cycle T×Discrete Time n); and n: Discrete Time

The first residual-error detector 12 detects a residual error $e\mathbf{1}_n$ at the first observation point 7. As shown in Equation (52), the residual error $e\mathbf{1}_n$ is a signal, which is produced by adding an adaptive transfer signal $z\mathbf{1}_n$ to a cyclic signal component d1. Note that the cyclic signal component d1 is produced when the cyclic signal f is transferred by way of the first transfer path 4. Moreover, the adaptive transfer signal $z\mathbf{1}_n$ is a signal, which is produced when the adaptive signal $y\mathbf{1}_n$ is transferred by way of the first transfer characteristic G1.

$$e1_n=d1+z1_n\quad\text{Equation (52):}$$

The first estimated-transfer-function calculator 13 calculates an estimated value Gh1 for a transfer function of the first transfer characteristic G1 based on the angular frequency ω of the primary frequency component of the cyclic signal f, which the vibration generation source 2 generates. The transfer function of the first transfer characteristic G1 comprises an amplitude component, and a phase component. That is, the first estimated-transfer-function calculator 13 calculates an estimated value Ah1 of the amplitude component of a transfer function of the first transfer characteristic G1, and an estimated value Φh1 of the phase component thereof. For example, it is advisable that the first estimated-transfer-function calculator 13 can store the respective estimated values Ah1 and Φh1, which comply with the angular frequency ω, as a map in advance. In this instance, the first estimated-transfer-function calculator 13 determines the respective estimated values Ah1 and Φh1 with the angular frequency ω of the cyclic signal f, which the vibration generation source 2 generates actually, and the stored map data.

The observation-point target-value setter 14 sets a residual-error target value $etarget_n$ based on the angular frequency ω. The residual-error target value $etarget_n$ comprises a cyclic component at the first observation point 7, and is specified according to Equation (53) in Example No. 1 of the present invention. As shown in Equation (53), the residual-error target value $etarget_n$ comprises an amplitude target value $a_e$, and have the same phase as the phase of the cyclic signal f. Moreover, the observation-point target-value setter 14 sets an amplitude target value $a_e$ so as to vary depending on the angular frequency ω of the cyclic signal f. Specifically, the observation-point target-value setter 14 determines an amplitude target value $a_e$ in compliance with an amplitude component of a signal, which is produced when a second cyclic signal f is transferred to the objective evaluation point 3 by way of the second transfer path 5. That is, the observation-point target-value setter 14 sets a residual-error target value $etarget_n$ so that the signal level becomes smaller at the objective evaluation point 3 and the difference between the crest and root of signal level becomes smaller for every frequency.

$$et\arg et_n=a_e\cdot\sin(\omega\cdot t_n)\quad\text{Equation (53):}$$

wherein:

$etarget_n$: Residual-error Target Value; and $a_e$: Amplitude Target Value

The first filter-coefficient updater 15 updates the first amplitude filter coefficient $a\mathbf{1}_n$ and first phase filter coefficient $\phi\mathbf{1}_n$ in according to Equations (54) and (55) based on the angular frequency ω, residual error $e\mathbf{1}_n$ at the first observation point 7, first transfer function estimated value Gh1 (Ah1, Φh1) and residual-error target value $etarget_n$. Moreover, the first filter-coefficient updater 15 updates the first amplitude filter coefficient $a\mathbf{1}_n$ and first phase filter coefficient $\phi\mathbf{1}_n$ in of the adaptive signal $y\mathbf{1}_n$, which the adaptive-signal generator 11 produces, with the updated first amplitude filter coefficient $a\mathbf{1}_n$ and first phase filter coefficient Ulna which the first filter-coefficient updater 15 has update.

$$a1_{n+1}=a1_n-\mu_{a1}\cdot Ah1\cdot(e1_n-et\arg et_n)\cdot\sin(\omega\cdot t_n+\phi1_n+\Phi_h1)\quad\text{Equation (54):}$$

$$\phi1_{n+1}=\phi1_n-\mu_{\phi1}\cdot Ah1\cdot a1_n\cdot(e1_n-et\arg et_n)\cos(\omega\cdot t_n+\phi1_n+\Phi h1)\quad\text{Equation (55):}$$

wherein:

$\mu_{a1}$: Step-size Parameter for First Amplitude;

$\mu_{\phi1}$: Step-size Parameter for First Phase;

Ah1: Amplitude Component of Estimated Value Gh1 for Transfer Function of First Transfer Characteristic G1;

Φh1: Phase Component of Estimated Value Gh1 for Transfer Function of First Transfer Characteristic G1; and $e\mathbf{1}_n$: Residual-error Signal Hereinafter, how to determine Equations (54) and (55) for updating the above-described first amplitude filter coefficient $a\mathbf{1}_n$ and phase filter coefficient $\phi\mathbf{1}_n$ will be described.

First of all, an evaluation function $J_n$ is defined as the square of the difference between the residual error $e\mathbf{1}_n$ and the residual error target value $etarget_n$ as specified in Equation (56). Moreover, the residual error $e\mathbf{1}_n$ can be expressed as specified in Equation (57). In addition, a gradient vector $\nabla_n$, which is produced by the least-squares method, can be expressed as specified in Equation (58).

$$J_n=(e1_n-et\arg et_n)^2\quad\text{Equation (56):}$$

$$\begin{aligned}e1&=d1+z1_n\\&=d1+[Ah1\cdot a1_n\cdot\sin(\omega\cdot t_n+\phi_n+\Phi h1)]\end{aligned}\quad\text{Equation (57)}$$

-continued $$\nabla_n = \frac{\partial J_n}{\partial W1_n} = \begin{pmatrix} \frac{\partial J_n}{\partial a1_n} \\ \frac{\partial J_n}{\partial \phi 1_n} \end{pmatrix} = \begin{pmatrix} 2\cdot Ah1\cdot(e1_n - etarget_n)\cdot\sin(\omega\cdot t_n + \phi 1_n + \Phi h1) \\ 2\cdot Ah1\cdot a1_n\cdot(e1_n - etarget_n)\cdot \\ \cos(\omega\cdot t_n + \phi 1_n + \Phi h1) \end{pmatrix} \quad \text{Equation (58)}$$

Then, the components of the gradient vector $\nabla_n$ are multiplied with an adequate step-size parameter, respectively. The resulting products are subtracted from a first filter-coefficient vector $W1_n$ ($a1_n$, $\phi 1_n$). The thus computed results are the first amplitude filter coefficient $a1_n$ and phase filter coefficient $\phi 1_n$, which are updated according to Equations (54) and (55).

The thus constructed adaptive controller 1 according to Example No. 1 of the present invention can converge the residual $e1_n$ at the first observation point 7 so as to match the residual-error target value $etarget_n$. Moreover, at the objective evaluation point 3, the adaptive controller 1 produces a signal, which is produced by adding the residual error $e1_n$ to the second cyclic signal component d2 being produced when the cyclic signal f is transferred by way of the second transfer path 5. If the first cyclic signal component d2 and the residual error $e1_n$ exhibit an identical amplitude to each other, but exhibit phases, which differ by 180 degrees to each other, as illustrated in FIG. 2, the signal at the objective evaluation point 3 turns into zero.

(3) First Modified Version of Example No. 1

In the above-described adaptive controller 1 according to Example No. 1 of the present invention, the adaptive signal $y1_n$ comprises a primary sine wave. It is advisable that the adaptive signal $y1_n$ can comprise a plurality of wave components with different orders. In this instance, the adaptive signal $y1_n$ can be expressed by Equation (59).

$$y1_n = \sum_{k=1}^{M} a1_{kn}\cdot\sin(k\cdot\omega\cdot t_n + \phi 1_{kn}) \quad \text{Equation (59)}$$

wherein:
k: Order;
M: Maximum Order;
$a1_{kn}$: First Amplitude Filter Coefficient $a1_n$ of "k"th Order Component; and
$\phi 1_{kn}$: First Phase Filter Coefficient $\phi 1_n$ of "k"th Order Component In the First Modified Version of Example No. 1, the adaptive controller 1 can set the amplitude target value $a_e$ of the residual-error target value $etarget_n$ so as to vary depending on the angular frequency ω and order k. Thus, the adaptive controller 1 can remove wave components with specific orders, or can leave them as they are. Therefore, the adaptive controller 1 can demonstrate advantages in the generation of favorable tone.

(4) Second Modified Version of Example No. 1

Moreover, in the above-described adaptive controller 1 according to Example No. 1 of the present invention, it is advisable to substitute following equation (60) for equation (55) for updating the first phase filter coefficient $\phi 1_n$ at the first filter-coefficient updater 15. In Equation (60), note that the amplitude component Ah1 and first amplitude filter coefficient $a1_n$, the estimated values for the transfer function of the first transfer characteristic G1, are eliminated from updating equation (55) according to Example No. 1.

$$\phi 1_{n+1} = \phi 1_n - \mu_{\phi 1}\cdot(e1_n - etarget_n)\cdot\cos(\omega\cdot t_n + \phi 1_n + \Phi h1) \quad \text{Equation (60):}$$

Even when thus using updating Equation (60) for the first phase filter coefficient $\phi 1_n$, the adaptive controller 1 according to Example No. 1 exhibits the convergence of the residual error $e1_n$, which little differs from that when using updating equation (55), at the first observation point 7. According to Equation (60), it is not necessary for the adaptive controller 1 to compute the amplitude component Ah1 and first amplitude filter coefficient $a1_n$ for the transfer function of the first transfer characteristic G1. Accordingly, it is possible to reduce the computational load to the adaptive controller 1. This fact results in an advantage that it is possible to use microcomputers with low computing power. Consequently, it is possible to manufacture the adaptive controller 1 at low cost.

(5) Detailed Construction of Adaptive Controller 1 according to Example No. 2

Next, a detailed construction of the adaptive controller 1 according to Example No. 2 of the present invention will be hereinafter described. Here, note that the adaptive controller 1 is an application to an instance where it stores a residual-error target value $etarget_n$ in advance and the residual-error target value $etarget_n$ comprises an amplitude target value $a_e$ and a phase target value $\phi_e$. Except for the observation-point target-value setter 14, the adaptive controller 1 according to Example No. 2 comprises the same constituent elements as those of the adaptive controller 1 according to Example No. 1. Only these arrangements will be described hereinafter, arrangements which distinguish the adaptive controller 1 according to Example No. 2 from the one according to Example No. 1.

In the adaptive controller 1 according to Example No. 2, the observation-point target-value setter 14 sets a residual-error target value $etarget_n$ based on the angular frequency ω. The residual-error target value $etarget_n$ comprises a cyclic component at the first observation point 7, and is specified according to Equation (61) in Example No. 2 of the present invention. As shown in Equation (61), the residual-error target value $etarget_n$ can comprise an amplitude target value $a_e$ and a phase target value $\phi_e$, and can have a phase which differs from the phase of the cyclic signal f. Moreover, the observation-point target-value setter 14 sets an amplitude target value $a_e$ and a phase target value $\phi_e$ so as to vary depending on the angular frequency ω of the cyclic signal f. Specifically, the observation-point target-value setter 14 determines an amplitude target value $a_e$ and a phase target value $\phi_e$ in compliance with an amplitude component of a signal and a phase component thereof, signal which is produced when a second cyclic signal f is transferred to the objective evaluation point 3 by way of the second transfer path 5. That is, the observation-point target-value setter 14 sets a residual-error target value $etarget_n$ so that the signal level becomes smaller at the objective evaluation point 3 and the difference between the crest and root of signal level becomes smaller for every frequency.

$$etarget_n = a_e\cdot\sin(\omega\cdot t_n + \phi_e) \quad \text{Equation (61):}$$

wherein:
$a_e$: Amplitude Target Value; and
$\Phi_e$: Phase Target Value

The first filter-coefficient updater 15 updates the first amplitude filter coefficient $a1_n$ and first phase filter coefficient $\phi1_n$ based on the resulting residual-error target value $etarget_n$. Moreover, the first filter-coefficient updater 15 updates the first amplitude filter coefficient $a1_n$ and first phase filter coefficient $\phi1_n$ of the adaptive signal $y1_n$, which the adaptive-signal generator 11 produces, with the updated first amplitude filter coefficient $a1_n$ and first phase filter coefficient $\phi1_n$, which the first filter-coefficient updater 15 has updated.

The thus constructed adaptive controller 1 according to Example No. 2 of the present invention can converge the residual error $e1_n$ at the first observation point 7 so as to match the residual-error target value $etarget_n$. Moreover, at the objective evaluation point 3, the adaptive controller 1 produces a signal, which is produced by adding the residual error $e1_n$ to the second cyclic signal component d2 being produced when the cyclic signal f is transferred by way of the second transfer path 5. If the first cyclic signal component d1, which is transferred by way of the first transfer path 4, exhibits a phase, which differs from the phase of the second cyclic signal component d2, which is transferred by way of the second transfer path 5, the adaptive controller 1 can make the second cyclic signal component d2 and the residual error $e1_n$exhibit an identical amplitude to each other, but exhibit phases, which differ by 180 degrees to each other, as illustrated in FIG. 3. Therefore, the adaptive controller 1 can make the signal at the objective evaluation point 3 zero.

Note that the above-described first modified version and second modified version of Example No. 1 can be likewise applied to the adaptive controller 1 according to Example No. 2 of the present invention.

(6) Detailed Construction of Adaptive Controller 1 according to Example No. 3

Next, a detailed construction of an adaptive controller 100 according to Example No. 3 of the present invention will be hereinafter described. Here, note that the adaptive controller 100 is an application to an instance where it sets a residual-error target value $etarget_n$ adaptively, and that the residual-error target value $etarget_n$ comprises an amplitude target value $a_e$, but does not comprise a phase target value $\phi_e$.

Figure 4:
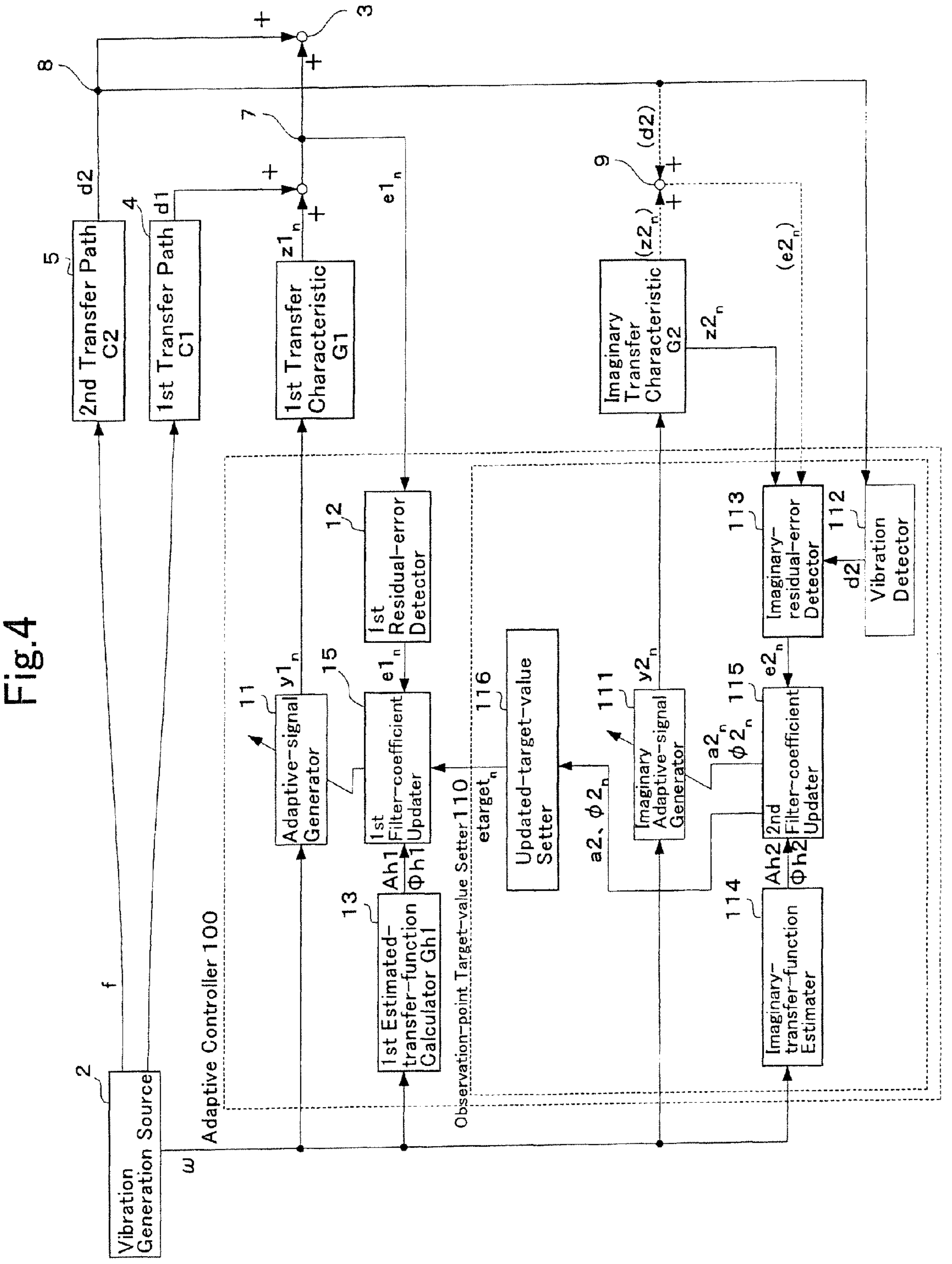
FIG. 4 is a block diagram for illustrating an adaptive controller 100 for cyclic signal according to Example No. 3 and Example No. 4 of the present invention.

FIG. 4 is a block diagram for illustrating the adaptive controller 100 according to Example No. 3 of the present invention and later-described Example No. 4 thereof. In the following descriptions on the adaptive controller 100 according to Example Nos. 3 and 4, note that, as shown in FIG. 4, the same constituent elements as those of the adaptive controller 1 according to Example Nos. 1 and 2 are designated with the same reference symbols and their detailed descriptions will be omitted. Specifically, the adaptive controller 100 according to Example No. 3 differs from the adaptive controller 1 according to Example No. 1 only in that it employs an observation-point target-value setter 110. The distinguishing observation-point target-value setter 110 alone will be described hereinafter.

The observation-point target-value setter 110 sets a residual-error target value $etarget_n$ adaptively. The observation-point target-value setter 110 comprises an imaginary-adaptive-signal generator 111, a vibration detector 112, an imaginary-residual-error detector 113, an imaginary-transfer-function estimater 114, a second filter-coefficient updater 115, and an updated-target-value setter 116.

The imaginary-adaptive-signal generator 111 produces an imaginary adaptive signal $y2_n$ in the second transfer path 5 imaginarily. The imaginary adaptive signal $y2_n$ is obtained according to Equation (62) based on an angular frequency ω of a primary frequency component of a cyclic signal f, which the vibration generation source 2 generates. Here, as can be seen from Equation (62), the imaginary adaptive signal $y2_n$ comprises a primary sine wave. Specifically, the primary sine wave contains a second amplitude filter coefficient $a2_n$, and a second phase filter coefficient $\phi2_n$, as the constituent elements. Moreover, the second filter-coefficient updater 115 updates the second amplitude filter coefficient $a2_n$ and second phase filter coefficient $\phi2_n$ adaptively.

$$y2_n = a2_n \cdot \sin(\omega \cdot t_n + \phi2_n) \qquad \text{Equation (62):}$$

wherein:

$y2_n$: Imaginary Adaptive Signal;

$a2_n$: Second Amplitude Filter Coefficient;

$\phi2_n$: Second Phase Filter Coefficient;

ω: Angular Frequency of Specific Frequency (i.e., One of Frequency Components of Cyclic Signal); and $t_n$: Time (i.e., Sampling Cycle T×Discrete Time n)

The vibration detector 112 detects a second-observation-point vibration d2, which occurs at a second observation point 8 in the second transfer path 5 based on the cyclic signal f. Note that the cyclic signal f turns into the second-observation-point vibration d2 when being transferred by way of a second transfer characteristic G2.

The imaginary residual-error detector 113 detects and/or calculates an imaginary residual error $e2_n$ at an imaginary observation point 9. As shown in Equation (63), the imaginary residual error $e2_n$ is a signal, which is produced by adding the imaginary adaptive signal $y2_n$ to the second-observation-point vibration d2 by way of the imaginary transfer characteristic G2 imaginarily. Note that the second-observation-point vibration d2 is produced when the cyclic signal f is transferred by way of the second transfer path 5. That is, the imaginary-residual-error detector 113 detects the imaginary residual error $e2_n$ based on the imaginary adaptive signal $y2_n$ and second-observation-point vibration d2.

$$e2_n = d2 + z2_n \qquad \text{Equation (63):}$$

The imaginary-transfer-function estimater 114 calculates an estimated value Gh2 for a transfer function of the imaginary transfer characteristic G2 based on the angular frequency ω of the primary frequency component of the cyclic signal f, which the vibration generation source 2 generates. The transfer function of the imaginary transfer characteristic G2 comprises an amplitude component, and a phase component. That is, the imaginary-transfer-function estimater 114 calculates an estimated value Ah2 of the amplitude component of a transfer function of the imaginary transfer characteristic G2, and an estimated value Φh2 of the phase component thereof. For example, it is advisable that the imaginary imaginary-transfer-function estimater 114 can store the respective estimated values Ah2 and Φh2, which comply with the angular frequency ω, as a map in advance. In this instance, the imaginary-transfer-function estimater 114 determines the respective estimated values Ah2 and Φh2 with the angular frequency ω of the cyclic signal f, which the vibration generation source 2 generates actually, and the stored map data.

The second filter-coefficient updater 115 updates the second amplitude filter coefficient $a2_n$ and second phase filter coefficient $\phi2_n$ according to Equations (64) and (65) based on the angular frequency ω, imaginary residual error $e2_n$ and imaginary-transfer-function estimated value Gh2 (Ah2, Φh2). Moreover, the second filter-coefficient updater 115 updates the second amplitude filter coefficient $a2_n$ and second phase filter coefficient $\Phi2_n$ of the imaginary adaptive signal $y2_n$, which the imaginary-adaptive-signal generator 111 produces, with the updated second amplitude filter coefficient $a2_n$ and second phase filter coefficient $\phi 2_n$, which the second filter-coefficient updater 115 has updated.

$$a2_{n+1}=a2_n-\mu_{a2}\cdot Ah2\cdot e2_n\cdot \sin(\omega\cdot t_n+\phi 2_n+\Phi h2) \quad \text{Equation (64):}$$

$$\Phi 2_{n+1}=\phi 2_n-\mu_{\phi 2}\cdot Ah2\cdot a2_n\cdot e2_n\cdot \cos(\omega\cdot t_n+\phi 2_n+\Phi h_2) \quad \text{Equation (65):}$$

wherein:

$\mu_{a2}$: Step-size Parameter for Second Amplitude;

$\mu_{\phi 2}$: Step-size Parameter for Second Phase;

Ah2: Amplitude Component of Estimated Value Gh2 for Transfer Function of Imaginary Transfer Characteristic G2;

Φh2: Phase Component of Estimated Value Gh2 for Transfer Function of Imaginary Transfer Characteristic G2; and $e2_n$: Imaginary Residual-error Signal Note herein that the method described so far for determining Equations (64) and (65) for updating the second amplitude filter coefficient $a2_n$ and second phase filter coefficient $\phi 2_n$ is the same as the above-described method for determining Equations (54) and (55) for updating the first amplitude filter coefficient $a1_n$ and first phase filter coefficient $\phi 1_n$ substantially.

The updated-target-value setter 116 sets the second amplitude filter coefficient $a2_n$, which the second filter-coefficient updater 115 has updated, at an amplitude target value $a_e$ according to Equation (66). Moreover, the updated-target-value setter 116 sets a residual-error target value $etarget_n$, which comprises the thus updated and set amplitude target value $a_e$, according to Equation (67). In addition, the updated-target-value setter 116 updates the residual-error target value $etarget_n$, which the first filter-coefficient updater 15 uses as a target value for updating the first amplitude filter coefficient $a1_n$ and first phase filter coefficient $\phi 1_n$ of the adaptive signal $y1_n$, based on the thus updated and set amplitude target value $a_e$.

$$a_e=a2_{n+1} \quad \text{Equation (66):}$$

$$et\arg et_n=a_e\cdot \sin(\omega\cdot t_n) \quad \text{Equation (67):}$$

The thus constructed adaptive controller 100 according to Example No. 3 of the present invention can converge the residual error $e1_n$ at the first observation point 7 so as to agree with the residual-error target value $etarget_n$. Moreover, the adaptive controller 100 according to Example No. 3, specifically, the updated-target-value setter 116 thereof, updates the residual-error target value $etarget_n$ so that the resultant updated residual-error target value $etarget_n$ agrees with the second-observation-point vibration d2 adaptively. Therefore, when the adaptive controller 100 produces a signal by adding the residual error $e1_n$ to the cyclic signal component d2, which is produced when the cyclic signal f is transferred by way of the second transfer path 5, at the objective evaluation point 3, the resulting signal turns into zero at the objective evaluation point 3.

(7) First Modified Version of Example No. 3

Moreover, in the above-described adaptive controller 100 according to Example No. 3 of the present invention, it is advisable to substitute following equation (68) for equation (65) for updating the second phase filter coefficient $\phi 2_n$ at the second filter-coefficient updater 115. In Equation (68), note that the amplitude component Ah2 and second amplitude filter coefficient $a2_n$, the estimated values for the transfer function of the second transfer characteristic G2, are eliminated from updating equation (65) according to Example No. 3.

$$\phi 2_{n+1}=\phi 2_n-\mu_{\phi 2}\cdot e2_n\cdot \cos(\omega\cdot t_n+\phi 2_n+\Phi h2) \quad \text{Equation (68):}$$

Even when thus using Equation (68) for updating the second phase filter coefficient $\phi 2_n$ the modified adaptive controller 100 according to Example No. 3 exhibits the convergence of the residual error $e2_n$, which little differs from that when using updating equation (65), at the imaginary observation point 9. According to Equation (68), it is not necessary for the adaptive controller 100 to compute the amplitude component Ah2 and second amplitude filter coefficient $a2_n$ for the transfer function of the second transfer characteristic G2. Accordingly, it is possible to reduce the computational load to the adaptive controller 100. This fact results in an advantage that it is possible to use microcomputers with low computing power. Consequently, it is possible to manufacture the adaptive controller 100 at low cost.

(8) Detailed Construction of Adaptive Controller 1 according to Example No. 4

Next, a detailed construction of the adaptive controller 100 according to Example No. 4 of the present invention will be hereinafter described. Here, note that the adaptive controller 100 is an application to an instance where it sets a residual-error target value $etarget_n$ adaptively, and the residual-error target value $etarget_n$ comprises an amplitude target value $a_e$ and a phase target value $\phi_e$. Except for the updated-target-value setter 116, the adaptive controller 100 according to Example No. 4 comprises the same constituent elements as those of the adaptive controller 100 according to Example No. 3. Only these arrangements will be described hereinafter, arrangements which distinguish the adaptive controller 100 according to Example No. 4 from the one according to Example No. 3.

In the adaptive controller 100 according to Example No. 4, the updated-target-value setter 116 sets a second amplitude filter coefficient $a2_n$ and a second phase filter coefficient $\phi 2_n$, which the second filter-coefficient updater 115 has updated, at an amplitude target value $a_e$ and a phase target value $\phi_e$ according to Equations (69) and (70). Moreover, the updated-target-value setter 116 sets a residual-error target value $etarget_n$, which comprises the thus updated and set amplitude target value $a_e$ and phase target valued $\phi_e$, according to Equation (71). In addition, the updated-target-value setter 116 updates the residual-error target value $etarget_n$, which the first filter-coefficient updater 15 uses as a target value for updating the first amplitude filter coefficient $a1_n$ and first phase filter coefficient $\phi 1_n$ of the adaptive signal $y1_n$, based on the thus updated and set amplitude target value $a_e$ and phase target valued $\phi_e$.

$$a_e=a2_{n+1} \quad \text{Equation (69):}$$

$$\phi_e=\phi 2_{n+1} \quad \text{Equation (70):}$$

$$et\arg et_n=a_e\cdot \sin(\omega\cdot t_n+\phi_e) \quad \text{Equation (71)}$$

The thus constructed adaptive controller 100 according to Example No. 4 of the present invention can converge the residual error $e1_n$ at the first observation point 7 so as to agree with the residual-error target value $etarget_n$. Moreover, the adaptive controller 100 according to Example No. 4, specifically, the updated-target-value setter 116 thereof, updates the residual-error target value $etarget_n$ so that the resultant updated residual-error target value $etarget_n$ agrees with the second-observation-point vibration d2 adaptively. Therefore, as illustrated in FIG. 3, even if the first cyclic signal component d1, which is transferred by way of the first transfer path 4, exhibits a phase, which differs from the phase of the second cyclic signal component d2, which is transferred by way of the second transfer path 5, the adaptive controller 100 can make the signal, which is produced by adding the residual error $e1_n$ to the second cyclic signal component d2 being produced when the cyclic signal f is transferred by way of the second transfer path 5, zero at the objective evaluation point 3.

Having now fully described the present invention, it will be apparent to one of ordinary skill in the art that many changes and modifications can be made thereto without departing from the spirit or scope of the present invention as set forth herein including the appended claims.

What is claimed is:

1. An adaptive controller for a cyclic signal, the adaptive controller for actively reducing influences of the cyclic signal, which the cyclic signal exerts to an objective evaluation point by way of a predetermined transfer path, by adding an adaptive signal, which synchronizes with the cyclic signal, to the cyclic signal, which a vibration generation source generates, the predetermined transfer path comprising a first transfer path, and a second transfer path which differs from the first transfer path;

the adaptive controller comprising:

an adaptive-signal generator for generating the adaptive signal, whose constituent element comprises a first amplitude filter coefficient and a first phase filter coefficient, in the first transfer path based on an angular frequency of a specific frequency, the specific frequency being at least one frequency component selected from a plurality of frequency components making the cyclic signal;

a first residual-error detector for detecting a first residual error, which results from adding the adaptive signal to the cyclic signal by way of a predetermined first transfer characteristic, at a first observation point, which is located between the adaptive-signal generator and the objective evaluation point in the first transfer path, the first residual error being added to a cyclic signal transferred by way of the second transfer path;

an observation-point target-value setter for setting an amplitude target value based on the angular frequency and a transfer characteristic of the second transfer path, the amplitude target value being comprised in a cyclic residual-error target value, the amplitude target value complying with the angular frequency, the cyclic residual-error target value being a target value of the first residual error at the first observation point; and a first filter-coefficient updater for updating the first amplitude filter coefficient and the first phase filter coefficient based on the angular frequency, the first residual error and the cyclic residual-error target value.

2. The adaptive controller according to claim 1, wherein the cyclic residual-error target value comprises a phase target value, which complies with the angular frequency.

3. The adaptive controller according to claim 1, further comprising:

a first estimated-transfer-function calculator for calculating a first transfer-function estimated value for a transfer function of the predetermined first transfer characteristic based on the angular frequency, wherein:

the adaptive-signal generator generates the adaptive signal in the first transfer path, the adaptive signal being produced according to following Equation (1); and the first filter-coefficient updater updates the first amplitude filter coefficient and the first phase filter coefficient in Equation (1) according to following Equations (2), (3) and (4) or following Equations (5), (6) and (7) based on the angular frequency, the first residual error, the first transfer-function estimated value and the cyclic residual-error target value, $$y1_n = a1_n \cdot \sin(\omega \cdot t_n + \phi1_n) \quad \text{Equation (1):}$$

wherein:

$y1_n$: Adaptive Signal;

$a1_n$: First Amplitude Filter Coefficient;

$\phi1_n$: First Phase Filter Coefficient;

ω: Angular Frequency of Specific Frequency (i.e., One of Frequency Components of Cyclic Signal);

$t_n$: Time (i.e., Sampling Cycle T×Discrete Time n); and n: Discrete Time;

$$a1_{n+1} = a1_n - \mu_{a1} \cdot Ah1 \cdot (e1_n - \text{etarget}_n) \cdot \sin(\omega \cdot t_n + \phi1_n + \Phi h1) \quad \text{Equation (2):}$$

$$\phi1_{n+1} = \phi1_n - \mu_{\phi1} \cdot (e1_n - \text{etarget}_n) \cdot \cos(\omega \cdot t_n + \phi1_n + \Phi h1) \quad \text{Equation (3):}$$

$$\text{etarget}_n = a_e \cdot \sin(\omega \cdot t_n) \quad \text{Equation (4):}$$

wherein:

$\mu_{a1}$: Step-size Parameter for First Amplitude;

$\mu_{\phi1}$: Step-size Parameter for First Phase;

Ah1: Amplitude Component of Estimated Value Gh1 for Transfer Function of First Transfer Characteristic Gh;

Φh1: Phase Component of Estimated Value Gh1 for Transfer Function of First Transfer Characteristic Gh;

$e1_n$: Residual-error Signal;

$\text{etarget}_n$: Residual-error Target Value; and $a_e$: Amplitude Target Value;

$$a1_{n+1} = a1_n - \mu_{a1} \cdot Ah1 \cdot (e1_n - \text{etarget}_n) \cdot \sin(\omega \cdot t_n + \phi1_n + \Phi h1) \quad \text{Equation (5):}$$

$$\phi1_{n+1} = \phi1_n - \mu_{\phi1} \cdot Ah1 \cdot a1_n \cdot (e1_n - \text{etarget}_n) \cdot \cos(\omega \cdot t_n + \phi1_n + \Phi h1) \quad \text{Equation (6):}$$

$$\text{etarget}_n = a_e \cdot \sin(\omega \cdot t_n). \quad \text{Equation (7):}$$

4. The adaptive controller according to claim 2, further comprising:

a first estimated-transfer-function calculator for calculating a first transfer-function estimated value for a transfer function of the predetermined first transfer characteristic based on the angular frequency, wherein:

the adaptive-signal generator generates the adaptive signal in the first transfer path, the adaptive signal being produced according to following Equation (8); and the first filter-coefficient updater updates the first amplitude filter coefficient and the first phase filter coefficient in Equation (8) according to following Equations (9), (10) and (11) or following Equations (12), (13) and (14) based on the angular frequency, the first residual error, the first transfer-function estimated value and the cyclic residual-error target value, $$y1_n = a1_n \cdot \sin(\omega \cdot t_n + \phi1_n) \quad \text{Equation (8):}$$

wherein:

y1: Adaptive Signal;

a1: First Amplitude Filter Coefficient;

ϕ1: First Phase Filter Coefficient;

ω: Angular Frequency of Specific Frequency (i.e., One of Frequency Components of Cyclic Signal);

$t_n$: Time (i.e., Sampling Cycle T×Discrete Time n); and n: Discrete Time;

$$a1_{n+1} = a1_n - \mu_{a1} \cdot Ah1 \cdot (e1_n - \text{etarget}_n) \cdot \sin(\omega \cdot t_n + \phi1_n + \Phi h1) \quad \text{Equation (9):}$$

$$\phi1_{n+1} = \phi1_n - \mu_{\phi1} \cdot (e1_n - \text{etarget}_n) \cdot \cos(\omega \cdot t_n + \phi1_n + \Phi h1) \quad \text{Equation (10):}$$

$$\text{etarget}_n = a_e \cdot \sin(\omega \cdot t_n + \phi_e) \quad \text{Equation (11):}$$

wherein:

$\mu_{a1}$: Step-size Parameter for First Amplitude;

$\mu_{\phi1}$: Step-size Parameter for First Phase;

Ah1: Amplitude Component of Estimated Value Gh1 for Transfer Function of First Transfer Characteristic Gh;

Φh1: Phase Component of Estimated Value Gh1 for Transfer Function of First Transfer Characteristic;

$e1_n$: Residual-error Signal;

$\text{etarget}_n$: Residual-error Target Value;

$a_e$: Amplitude Target Value; and
$\phi_e$: Phase Target Value;

$$a1_{n+1}=a1_n-\mu_{a1}\cdot Ah1\cdot(e1_n-\text{etarget}_n)\cdot\sin(\omega\cdot t_n+\phi1_n+\Phi h1) \quad \text{Equation (12):}$$

$$\phi1_{n+1}=\phi1_n-\mu_{\phi1}\cdot Ah1\cdot a1_n\cdot(e1_n-\text{etarget}_n)\cdot\cos(\omega\cdot t_n+\phi1_n+\Phi h1) \quad \text{Equation (13):}$$

$$\text{etarget}_n=a_e\cdot\sin(\omega\cdot t_n+\phi_e). \quad \text{Equation (14):}$$

5. The adaptive controller according to claim 1, wherein the observation-point target-value setter stores the amplitude target value, which complies with the angular frequency, in advance, and sets the amplitude target value based on the angular frequency of the cyclic signal, which the vibration generation source generates actually.

6. The adaptive controller according to claim 1, wherein the observation-point target-value setter comprises:

an imaginary adaptive-signal generator for generating an imaginary adaptive signal in the second transfer path imaginarily, the imaginary adaptive signal being produced according to following Equation (15), whose constituent elements comprise a second amplitude filter coefficient and a second phase filter coefficient, based on the angular frequency;

a vibration detector for detecting a second-observation-point vibration, which occurs based on the cyclic signal, at a second observation point in the second transfer path;

an imaginary residual-error detector for detecting an imaginary residual error, which occurs by adding the imaginary adaptive signal to the cyclic signal imaginarily by way of a predetermined imaginary transfer characteristic at the second observation point based on the imaginary adaptive signal and the second-observation-point vibration;

an imaginary transfer-function estimator for calculating an imaginary transfer-function estimated value for a transfer function of the predetermined imaginary transfer characteristic based on the angular frequency;

a second filter-coefficient updater for updating the second amplitude filter coefficient and the second phase filter coefficient in Equation (15) according to following Equations (16) and (17) or following Equations (18) and (19) based on the angular frequency, the imaginary residual error and the imaginary transfer-function estimated value; and an updated target-value setter for setting the updated second amplitude filter coefficient at the amplitude target value according to following Equation (20), $$y2_n=a2_n\cdot\sin(\omega\cdot t_n+\phi2_n) \quad \text{Equation (15):}$$

wherein:
$y2_n$: Imaginary Adaptive Signal;
$a2_n$: Second Amplitude Filter Coefficient
$\phi2_n$: Second Phase Filter Coefficient
$\omega$: Angular Frequency of Specific Frequency (i.e., One of Frequency Components of Cyclic Signal); and
$t_n$: Time (i.e., Sampling Cycle T×Discrete Time n);

$$a2_{n+1}=a2_n-\mu_{a2}\cdot Ah2\cdot e2_n\cdot\sin(\omega\cdot t_n+\phi2_n+\Phi h2) \quad \text{Equation (16):}$$

$$\phi2_{n+1}=\phi2_n-\mu_{\phi2}\cdot e2_n\cdot\cos(\omega\cdot t_n+\phi2_n+\Phi h2) \quad \text{Equation (17):}$$

wherein:
$\mu_{a2}$: Step-size Parameter for Second Amplitude;
$\mu_{\phi2}$: Step-size Parameter for Second Phase;
Ah2: Amplitude Component of Estimated Value Gh2 for Transfer Function of Imaginary Transfer Characteristic G2;
Φh2: Phase Component of Estimated Value Gh2 for Transfer Function of Imaginary Transfer Characteristic G2; and
$e2_n$: Imaginary Residual-error Signal;

$$a2_{n+1}=a2_n-\mu_{a2}\cdot Ah2\cdot e2_n\cdot\sin(\omega\cdot t_n+\phi2_n+\Phi h2) \quad \text{Equation (18):}$$

$$\phi2_{n+1}=\phi2_n-\mu_{\phi2}\cdot Ah2\cdot a2_n\cdot e2_n\cdot\cos(\omega\cdot t_n+\phi2_n+\Phi h2) \quad \text{Equation (19):}$$

$$a_e=a2_{n+1}. \quad \text{Equation (20):}$$

7. The adaptive controller according to claim 2, wherein:

the observation-point target value setter sets the phase target value based on a transfer characteristic of the second transfer path.

8. The adaptive controller according to claim 7, wherein the observation-point target-value setter stores the phase target value, which complies with the angular frequency, in advance, and sets the phase target value based on the angular frequency of the cyclic signal, which the vibration generation source generates actually.

9. The adaptive controller according to claim 7, wherein the observation-point target-value setter comprises:

an imaginary adaptive-signal generator for generating an imaginary adaptive signal in the second transfer path imaginarily, the imaginary adaptive signal being produced according to following Equation (21), whose constituent elements comprise a second amplitude filter coefficient and a second phase filter coefficient, based on the angular frequency;

a vibration detector for detecting a second-observation-point vibration, which occurs based on the cyclic signal, at a second observation point in the second transfer path;

an imaginary residual-error detector for detecting an imaginary residual error, which occurs by adding the imaginary adaptive signal to the cyclic signal imaginarily by way of a predetermined imaginary transfer characteristic at the second observation point based on the imaginary adaptive signal and the second-observation-point vibration;

an imaginary transfer-function estimator for calculating an imaginary transfer-function estimated value for a transfer function of the predetermined imaginary transfer characteristic based on the angular frequency;

a second filter-coefficient updater for updating the second amplitude filter coefficient and the second phase filter coefficient in Equation (21) according to following Equations (22) and (23) or following Equations (24) and (25) based on the angular frequency, the imaginary residual error and the imaginary transfer-function estimated value; and an updated target-value setter for setting the updated second phase filter coefficient at the phase target value according to following Equation (26), $$y2_n=a2_n\cdot\sin(\omega\cdot t_n+\phi2_n) \quad \text{Equation (21):}$$

wherein:
$y2_n$: Imaginary Adaptive Signal;
$a2_n$: Second Amplitude Filter Coefficient
$\phi2_n$: Second Phase Filter Coefficient
$\omega$: Angular Frequency of Specific Frequency (i.e., One of Frequency Components of Cyclic Signal); and
$t_n$: Time (i.e., Sampling Cycle T×Discrete Time n);

$$a2_{n+1}=a2_n-\mu_{a2}\cdot Ah2\cdot e2_n\cdot\sin(\omega\cdot t_n+\phi2_n+\Phi h2) \quad \text{Equation (22):}$$

$$\phi2_{n+1}=\phi2_n-\mu_{\phi2}\cdot e2_n\cdot\cos(\omega\cdot t_n+\phi2_n+\Phi h2) \quad \text{Equation (23):}$$

wherein:
$\mu_{a2}$: Step-size Parameter for Second Amplitude;
$\mu_{\phi2}$: Step-size Parameter for Second Phase;

Ah2: Amplitude Component of Estimated Value Gh2 for Transfer Function of Imaginary Transfer Characteristic G2;

Φh2: Phase Component of Estimated Value Gh2 for Transfer Function of Imaginary Transfer Characteristic G2; and $e2_n$: Imaginary Residual-error Signal;

$$a2_{n+1}=a2_n-\mu_{a2}\cdot Ah2\cdot e2_n\cdot\sin(\omega\cdot t_n+\phi 2_n+\Phi h2) \quad \text{Equation (24):}$$

$$\phi 2_{n+1}=\phi 2_n-\mu_{\phi 2}\cdot Ah2\cdot a2_n\cdot e2_n\cdot\cos(\omega\cdot t_n+\phi 2_n+\Phi h2) \quad \text{Equation (25):}$$

$$\phi_e=\phi 2_{n+1}. \quad \text{Equation (26):}$$

* * * * *